(12) United States Patent
Somayajula et al.

(10) Patent No.: US 6,473,021 B1
(45) Date of Patent: Oct. 29, 2002

(54) ANALOG TO DIGITAL CONVERSION CIRCUITS, SYSTEMS AND METHODS WITH GAIN SCALING SWITCHED-CAPACITOR ARRAY

(75) Inventors: Shyam S Somayajula, Austin, TX (US); Karl Ernesto Thompson, Converse, TX (US)

(73) Assignee: Cirrus Logic, Inc.

( * ) Notice: Subject to any disclaimer, the term of this patent is extended or adjusted under 35 U.S.C. 154(b) by 0 days.

(21) Appl. No.: 09/919,410

(22) Filed: Jul. 30, 2001

(51) Int. Cl.[7] .............................................. H03M 1/12
(52) U.S. Cl. ........................................ 341/172; 341/155
(58) Field of Search ................................. 341/172, 155, 341/144, 118, 120

(56) References Cited

U.S. PATENT DOCUMENTS

| | | | | |
|---|---|---|---|---|
| 4,399,426 A | * | 8/1983 | Tan .............................. | 341/120 |
| 4,799,042 A | * | 1/1989 | Confalonieri et al. ........ | 341/118 |
| 4,831,381 A | | 5/1989 | Hester .......................... | 341/172 |
| 5,006,853 A | * | 4/1991 | Kiriaki et al. ............... | 341/172 |
| 5,166,687 A | * | 11/1992 | Yung ........................... | 341/172 |
| 5,258,761 A | * | 11/1993 | Fotohi et al. ................ | 341/172 |
| 5,369,407 A | * | 11/1994 | Yung et al. .................. | 341/172 |
| 5,434,569 A | * | 7/1995 | Yung et al. .................. | 341/172 |
| 5,581,252 A | * | 12/1996 | Thomas ....................... | 341/172 |
| 5,684,487 A | * | 11/1997 | Timko ......................... | 341/172 |
| 5,852,415 A | * | 12/1998 | Cotter et al. ................. | 341/172 |
| 5,920,275 A | * | 7/1999 | Hester .......................... | 341/172 |

* cited by examiner

*Primary Examiner*—Michael Tokar
*Assistant Examiner*—Jean Bruner Jeanglaude
(74) *Attorney, Agent, or Firm*—James J. Murphy; Winstead Sechrest & Minick

(57) ABSTRACT

A method of gain scaling in a charge redistribution analog to digital converter includes the step of segmenting a bit weighted capacitor array into a first segment having at least one capacitor representing a least significant bit and a second segment having at least one capacitor representing a most significant bit. During a sampling phase, an input signal is sampled onto the at least one capacitor of the second segment while the at least one capacitor of the first segment is coupled to a fixed voltage.

16 Claims, 5 Drawing Sheets

ANALOG TO DIGITAL CONVERSION CIRCUITS, SYSTEMS AND METHODS WITH GAIN SCALING SWITCHED-CAPACITOR ARRAY

CROSS-REFERENCE TO RELATED APPLICATIONS

This application for patent is related to the following applications for patent:

U.S. patent application Ser. No. 09/919,181, filed Jul. 30, 2001, entitled "CIRCUITS AND METHODS FOR OFFSET VOLTAGE COMPENSATION IN A CHARGE REDISTRIBUTION DIGITAL TO ANALOG CONVERTER" by inventor Shyam S. Somayajula currently pending;

U.S. patent application Ser. No. 09/919,014, filed Jul. 30, 2001 by inventor Somayajula, entitled "A HIGH SPEED SUCCESSIVE APPROXIMATION RETURN PATH AND DATA CONVERSION METHODS AND CIRCUITS USING THE SAME" currently pending;

U.S. patent application Ser. No. 09/919,411, filed Jul. 30, 2001 by inventor Somayajula, entitled "CIRCUITS AND METHODS FOR LATCH METASTABILITY DETECTION AND COMPENSATION AND SYSTEMS USING THE SAME" currently pending U.S. patent application Ser. No. 09/918,852, filed Jul. 30, 2001 by inventor Somayajula, entitled "CIRCUITS AND METHODS FOR LINEARIZING CAPACITOR CALIBRATION AND SYSTEMS USING THE SAME", currently pending;

U.S. patent application Ser. No. 09/918,616, filed Jul. 30, 2001 by inventor Somayajula, entitled "HIGH SPEED, LOW-POWER SHIFT REGISTER AND CIRCUITS AND METHODS USING THE SAME" currently pending; and U.S. patent application Ser. No. 09/919,021, filed Jul. 30, 2000 by inventor Somayajula, entitled "METHODS AND CIRCUITS FOR COMPENSATING FOR FINITE COMMON MODE REJECTION IN SWITCHED CAPACITOR CIRCUITS" currently pending.

FIELD OF INVENTION

The present invention relates in general to switched capacitor circuits and in particular to analog to digital conversion circuits, systems and methods with gain scaling switched-capacitor array.

BACKGROUND OF INVENTION

One particular technique for performing analog to digital (A/D) conversion is through successive approximation. The basic successive approximation A/D converter (ADC) includes an analog comparator and a clocked feedback loop having a successive approximation register (SAR) and a digital to analog converter (DAC).

Generally, the analog input signal voltage is sampled onto an array of weighted capacitors, during the sampling phase, the top plates of which are coupled to one comparator input. The other comparator input is coupled to a comparison voltage, which could be a fixed reference voltage in a single-ended system or the voltage at the top plates of second capacitor array in a differential system.

During the first clock cycle of the subsequent conversion phase, the bottom plate of the capacitor representing the digital most significant bit (MSB) is coupled to a reference voltage while the bottom plates of the remaining capacitors in the array are coupled to ground or a second reference voltage (ground will be assumed here). The new top plate voltage appears at the input of the comparator and is compared against the comparison voltage. The new top plate voltage is a scaled version of $$\left[\frac{Voef}{2} - ain\right] \cdot k$$

where k is the ratio of capacitors. The sign of this quantity is the factor of interest. If the new top plate voltage is below the comparison voltage, then the MSB is "kept" by the SAR in the feedback loop by maintaining its bottom plate coupled to the reference voltage. On the other hand, if the top plate voltage is above the comparison voltage, the SAR couples and the bottom plate of the MSB capacitor to ground. The state of the MSB capacitor represents the MSB of the digital output word as a Logic 1. The bottom plate of the second MSB is then coupled to the reference voltage and the same test is performed to determine the state of the next digital code bit. The successive approximation algorithm continues by repeating this procedure for the remaining capacitors in the array such that the voltage difference at the inputs to the comparator converge to zero. At the end of this bit cycling process, the configuration of the switches coupling the bottom plates either to Vref or Gnd represents the input sample in digital form.

Successive approximation A/D converters are useful a wide range of applications, including data acquisition, test equipment, instrumentation, cellular communications, among others. Notwithstanding, in order to improve and broaden the utility of this type of A/D converter, significant challenges remain to be addressed. These challenges include improving the device speed given a set of process constraints, reducing the coding error rate, handling metastable states and calibration of the DAC.

SUMMARY OF INVENTION

The principles of the present invention are embodied in circuits and methods for gain scaling in charge redistribution analog to digital converters. According to one such embodiment, a method of gain scaling is disclosed which includes the step of segmenting a bit weighted capacitor array into a first segment having at least one capacitor representing least significant bit and a second segment having at least one capacitor representing most significant bit. During a sampling phase, an input signal is sampled onto the at least one capacitor of the second segment while the at least one capacitor of the first segment is coupled to a fixed voltage.

The inventive principles are also embodied in an analog to digital converter including a comparator, an array of capacitors coupled to an input of the comparator, and switching circuitry for controlling the voltages stored on the array of capacitors. In particular, the array of capacitors is segmented into a first segment of capacitors representing most significant bits and a second segment of capacitors representing least significant bits. The switching circuitry during a sampling phase selectively couples the capacitors of the first segment to an analog input of the converter and the capacitors of the second segment to a fixed voltage.

Among the advantages obtained through application of the inventive principles, is a substantial reduction in the amount of parasitic capacitance which must be charged or discharged during the sampling phase. This allows the analog to digital converter to operate at higher sampling rates and improves the operational linearity.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1–6D of the drawings, in which like numbers designate like parts.

Figure 1:
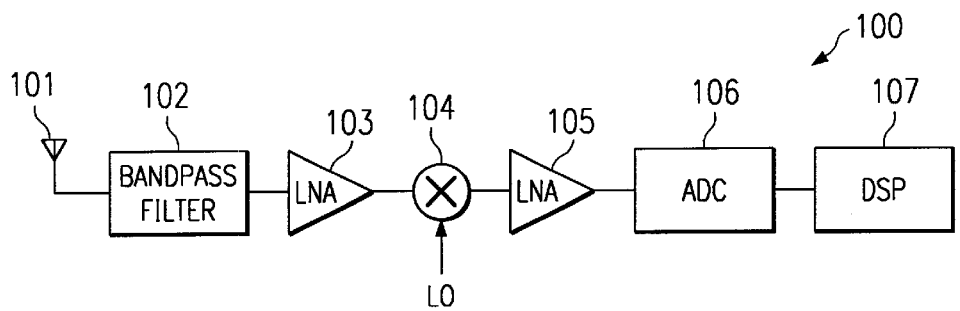
FIG. 1 is a high level block diagram of a digital receiver suitable for describing the principles of the present invention.

FIG. 1 is a high level block diagram of a digital receiver 100 suitable for describing the principles of the present invention. Generally, receiver 100 includes an RF input port or antenna 101 for receiving an RF signal, such as those used in telecommunications, and radio and television transmission. The desired RF signal is then extracted from the received signal by a bandpass filter 102. A low noise amplifier (LNA) 103 sets the system noise figure before the RF signal is downconverted in frequency by a mixer stage 104 operating in response to a local oscillator (LO). The output of mixer stage 104 may be passed through a second low noise amplifier (LNA) 105 before conversion into the digital domain.

In system 100, analog to digital conversion is performed using analog to digital converter (ADC) 200 discussed in detail below. Once converted into the digital domain, the received data can be processed using a digital signal processor (DSP) subsystem 106.

Figure 2:
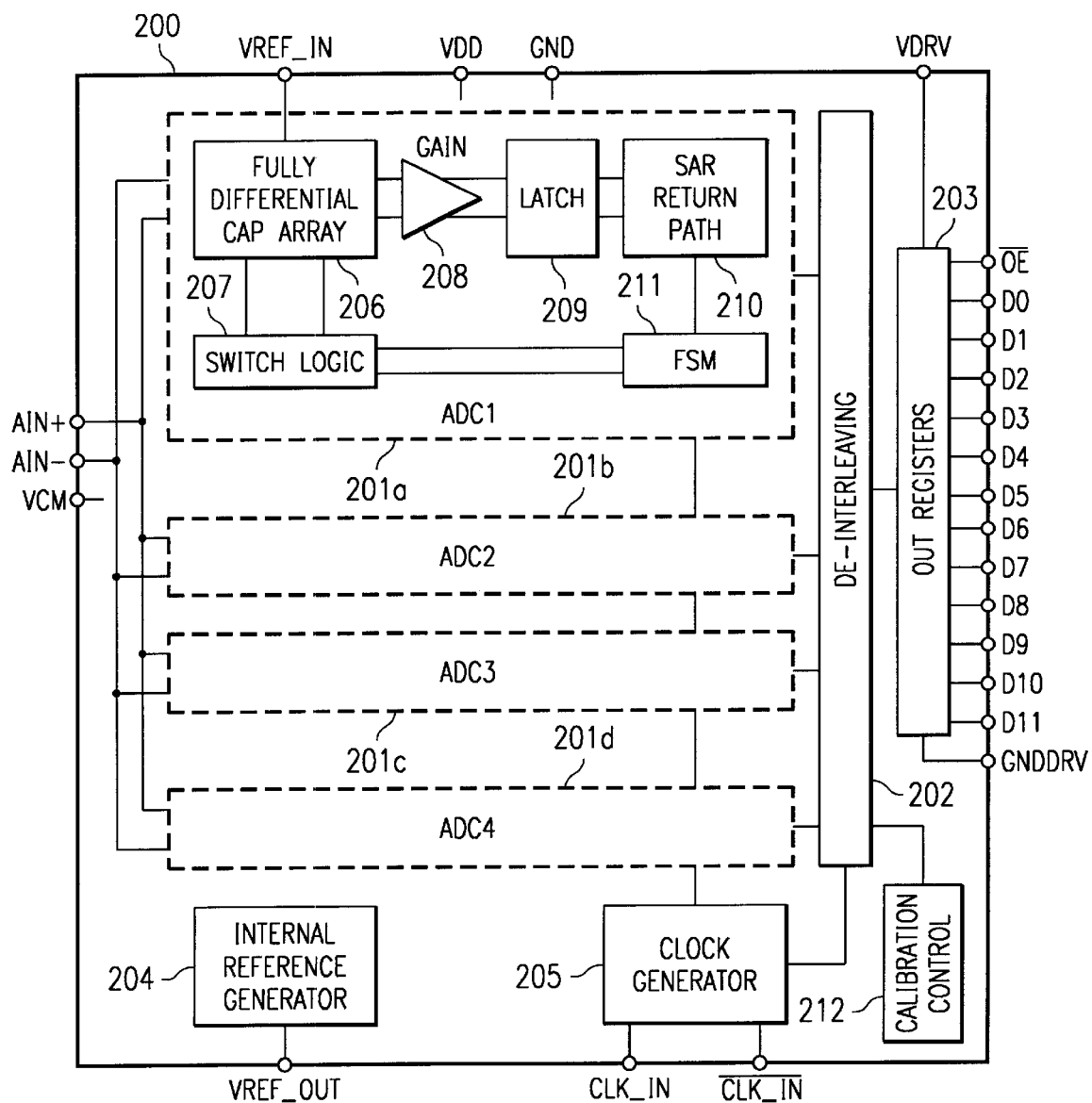
FIG. 2 is a high level functional block diagram of a single-chip analog to digital converter suitable for describing the present inventive concepts.

FIG. 2 is a high level functional block diagram of a single-chip analog to digital converter 200 suitable for describing the present inventive concepts. A/D converter 200 is based on 4 interleaved successive-approximation A/D converters (ADCs) 201, which will be discussed further below. The digitally coded samples are de-interleaved in block 202 and output through output register 203. A/D converter 200 also includes an on-chip reference voltage generator 204, clock generator 205 and clock generation circuitry 206.

Each of the ADCs 202 includes a fully differential capacitor array 206 under control of switch control circuitry 207 which implements the charge redistribution DAC discussed below. During the tracking mode, capacitor array 206 samples the input voltage at the differential analog inputs AIN+ and AIN−. During the hold mode, the sampled charge is held while the successive approximation algorithm generates the digital bits.

A gain stage 208 with minimal gain provides signal isolation in front of latch (comparator) 209. SAR return path 210 and FSM 211 feedback determine whether a bit is kept (i.e. corresponding capacitor remains coupled to the reference voltage) or not kept (i.e. the corresponding capacitor is recoupled to ground).

In a conventional charge redistribution DAC, the bottom plate of a graduated (bit-weighted) filter array is coupled to the input during the sampling phase and all capacitors are charged to the input signal voltage. After the capacitors are charged, their bottom plates are coupled to ground during hold phase such that the top plates of the capacitors are at a voltage $V_X$ which is approximately equal to $-A_{IN}$, where $A_{IN}$ is the input sample voltage. During bit cycling, the bottom plate of the capacitor representing the MSB is coupled to the reference and the voltage of the top plate compared against the reference. The bottom capacitors of the remaining capacitors remain coupled to ground to form a voltage divider. If upper plate voltage is now below the reference, then the MSB capacitor continues to be coupled to the reference (i.e. the bit is kept), otherwise the bottom plate of the capacitor is recoupled to ground (i.e. the bit is not kept).

Figure 3:
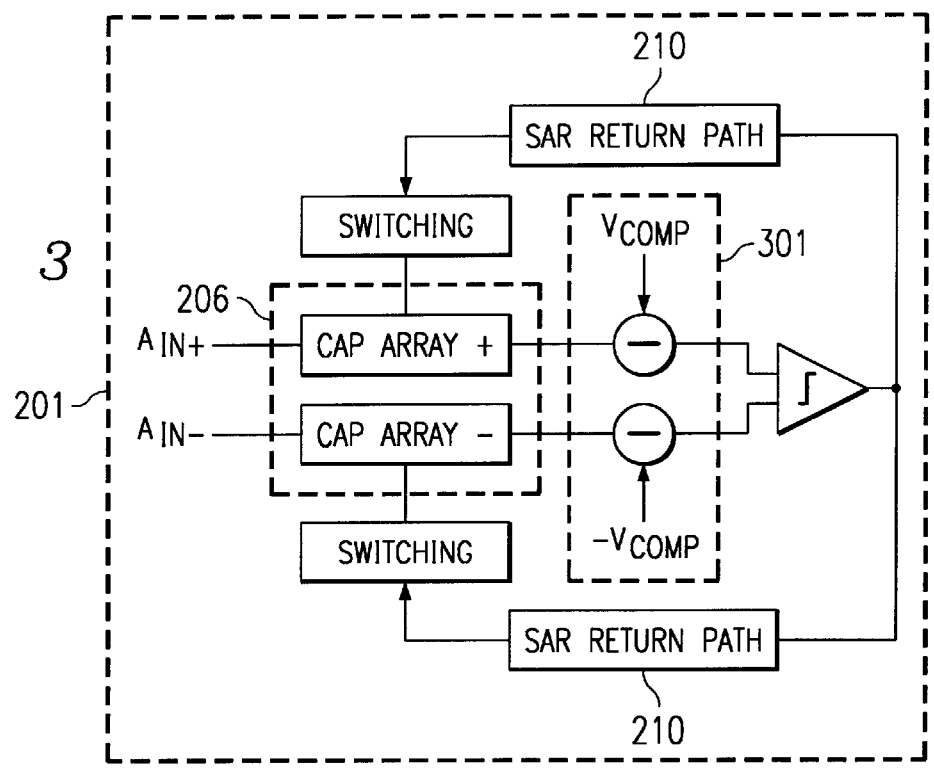
FIG. 3 is a high level functional block diagram of an analog to digital converter with offset voltage compensation circuitry according to the inventive concepts.

One circuit embodiment of the principles of the present invention is shown in FIG. 3. In this case, an error cancellation (compensation) stage 301, which is preferably a subtractor, is placed in front of the comparator. This cancellation stage presents a voltage to the comparator inputs, as determined during a calibration procedure, and cancels out the input voltage offset. Cancellation stage 301 performs the cancellation operation in the analog domain, although its control is performed in the digital domain. A preferred charge redistribution DAC suitable with an integral offset compensation (cancellation) circuitry is discussed below in conjunction with FIG. 4. It should be noted that the present invention is not limited to error compensation loops utilizing charge redistribution DACs. In alternative embodiments, the DAC can also be a resistor-based DAC or a current-based DAC.

Figure 4A:
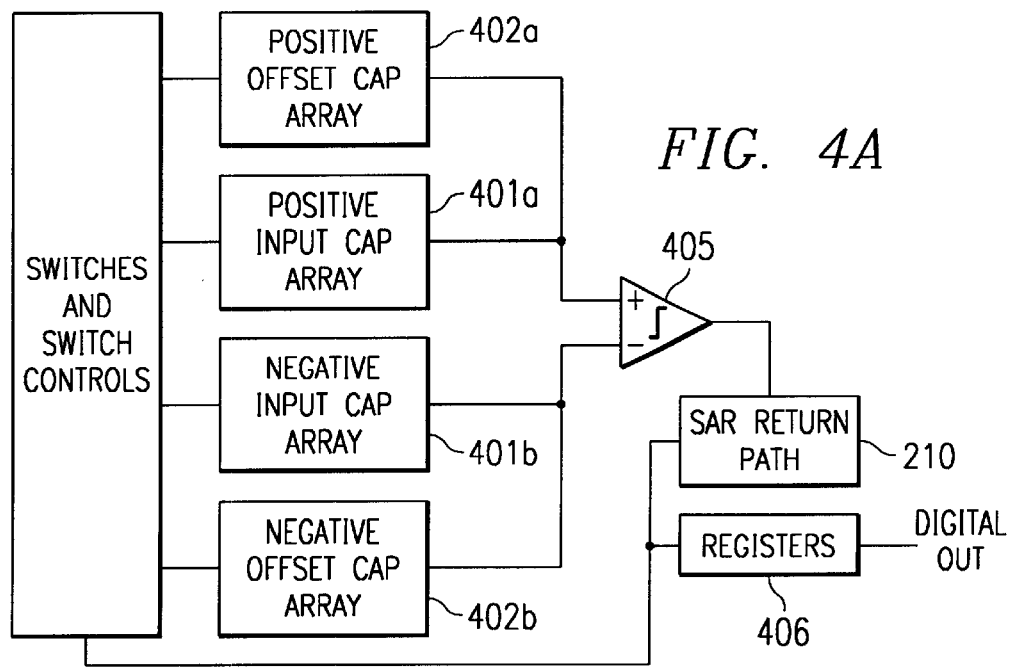
FIG. 4A is a functional block diagram of switched-capacitor charge redistribution ADC embodying the present principles.
Figure 4B:
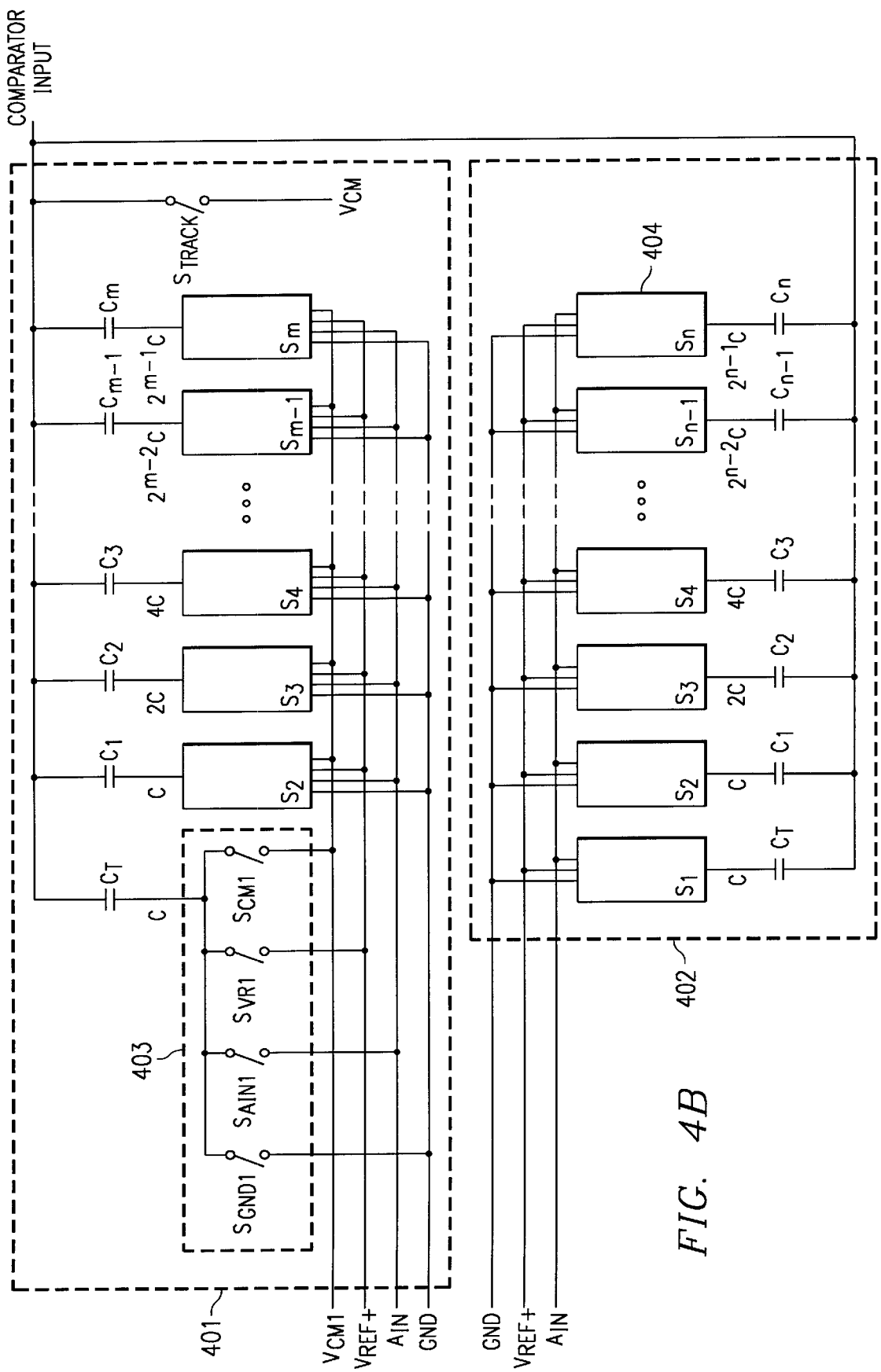
FIG. 4B illustrates one pair of the capacitor arrays of FIG. 4A, in further detail.

A switched-capacitor charge redistribution DAC 400 embodying the present principles is shown in FIG. 4A. In this embodiment, two capacitor arrays are provided for each of the paths into the positive and negative differential inputs into comparator 404, namely, Input Capacitor Array 401 and Offset Compensation Capacitor Array 402. One pair of arrays 401 and 402 is shown in further detail in FIG. 4B. Input Capacitor Array 401 comprises a termination capacitor $C_T$ and an array of capacitors $C_{INi}$, i=1 to m graduated in the sequence C, 2C, 4C, ... $2^{m-2}$C, $2^{m-1}$C(ff). In the following discussion, input capacitors 401 coupled to the positive comparator input are designated $C_{INPi}$ and those coupled to the negative comparator input designated $C_{INNi}$. Generally, the termination capacitors do not participate in the bit-cycling process, except during capacitance calibration (trim) operations.

Offset Compensation Capacitor Array 402, comprises a termination capacitor $C_T$ and an array of capacitors $C_{OFFJ}$, j=1 to n, graduated in the sequence C, 2C, 4C, ... $2^{n-2}$C, $2^{n-1}$C (ff). Offset capacitors coupled to the positive comparator input are designated $C_{OFFPj}$ and those coupled to the negative comparator input $C_{OFFNj}$.

The bottom plate of each capacitor in array 401 is associated with a set of switches 403, one of which is shown in further detail. Specifically, each input array switch set includes a switch $S_{AINi}$ for coupling the plate to the analog input voltage $A_{IN+}$ or $A_{IN-}$, a switch $S_{VRi+}$ for coupling to the positive reference voltage rail $V_{REF+}$, a switch $S_{GNDi}$ for coupling to the negative reference rail $V_{REF-}$, in this case GND, and a switch $S_{CMi}$ for coupling to the input common mode voltage $V_{CMI}$ referenced to the differential inputs $A_{IN+}$ and $A_{IN-}$.

A similar set of switches 404, indexed j=1 to m, selectively couple the bottom plates of the capacitors of offset array 402 to the input signal ($A_{IN+}$ or $A_{IN-}$) and the reference voltage ($V_{REF+}$) and GND. After the SAR bit cycling process, the state of switches 403 represent the digitally coded input sample and is stored in registers 406 for output.

An offset calibration cycle is run to selectively charge the capacitors of the offset arrays 402a,b at the positive and negative inputs to the comparator. In the following discussion, "complementary" sets of capacitors are those coupled by the appropriate switches at a given instant to opposing reference voltages. For example, if capacitor $C_{INPi}$ in input array 401a at the positive comparator input is coupled to $V_{REF}$, then the corresponding capacitor in $C_{INi}$ in input array 401b at the negative comparator input is coupled to GND, and vice versa. Similarly, if a capacitor $C_{OFFPj}$ in offset array 402a is coupled to $V_{REF}$, capacitor $C_{OFFNj}$ in offset array 402b is coupled to GND, and vice versa.

During the sampling phase of the calibration procedure, the bottom plates of all input capacitors $C_{INPi}$(i=1 to m) and $C_{INi}$(i=1 to m) are coupled to the input common mode voltage $V_{CMi}$. The MSB capacitor $C_{OFFMSBP}$ of the positive path capacitor array is coupled to $V_{REF}$ and the complementary MSB capacitor $C_{OFFMSBN}$ is coupled to Gnd. The bottom plates of the remaining positive path offset capacitors $C_{OFFLSBP}$ are coupled to ground and those of the remaining negative path offset capacitors $C_{OFFLSBN}$ are coupled to $V_{REF}$. The top plates of all the input and offset capacitors, for both paths are coupled to a common voltage according to the comparator design. For a more complete discussion of the compensation, reference is now made to copending, coassigned patent application Ser. No. 09/919,181 incorporated above by reference.

Figure 5:
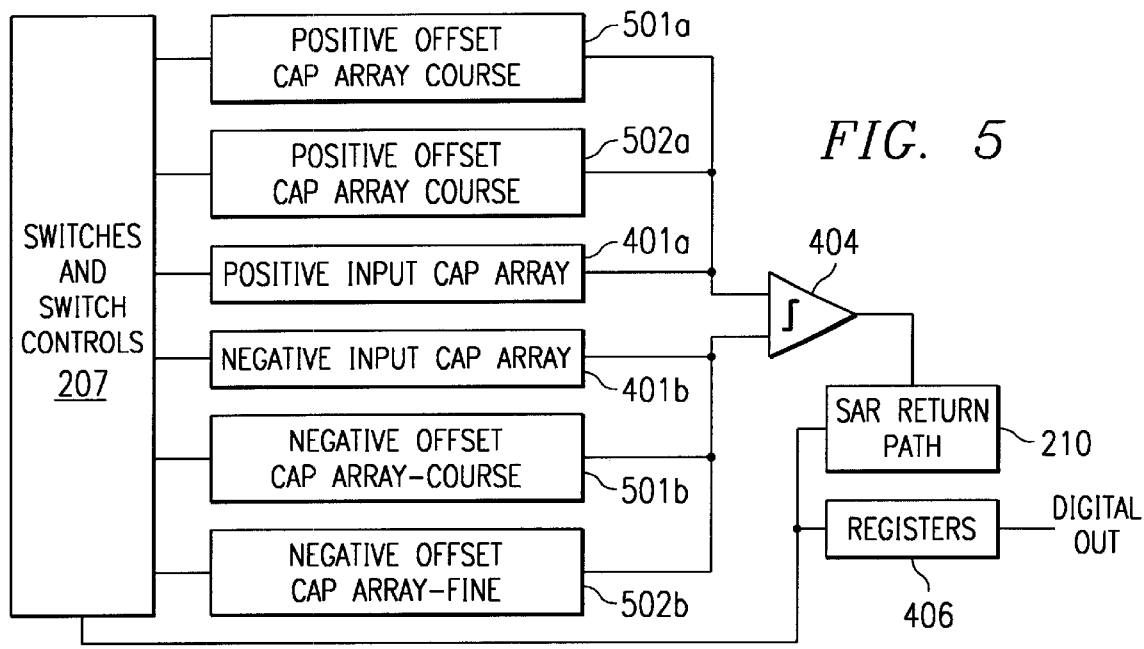
FIG. 5 is a functional block diagram of a second charge redistribution ADC embodying the present invention.

An alternate embodiment is depicted in FIG. 5 Here, two offset arrays are provided at each of the comparator inputs. Specifically, each input is associated with a coarse offset array 501 and a fine offset array 502. Structurally, these arrays are similar to offset arrays 402 discussed above and include an array of weighted capacitors and a corresponding set of switches. The number of weighted capacitors in the coarse and fine arrays are not necessarily equal. For example, the coarse array could be an 5-bit array and the fine array a 8-bit array.

During the sampling phase of calibration, the MSB capacitors of the both coarse and fine arrays of the positive input path are coupled to $V_{REF}$ while the MSB capacitors of the coarse and fine arrays of the negative input path are coupled of Gnd. The remaining capacitors in both the coarse and fine arrays of the positive input path are coupled to Gnd while those of the negative input path are coupled to $V_{REF}$. The input capacitors sample $V_{CMi}$ as discussed above.

During the calibration conversion phase, a bit cycling operation is first performed through coarse arrays 501 followed by a bit cycling operation through the fine arrays 502. The results are coarse and fine offset codes for the positive and negative input paths.

The normal mode sample conversion is performed in a manner similar to that discussed above. During the sampling phase, with the MSB capacitors of the fine and coarse offset compensation arrays of the positive path coupled to $V_{REF}$ and those of the fine and coarse offset compensation arrays of the negative path coupled of Gnd. The remaining (LSB) capacitors of the positive path fine and coarse arrays are coupled to Gnd the remaining (LSB) capacitors of the negative path coupled to $V_{REF}$.

During the normal mode conversion phase, the offset codes determined during calibration are set into the fine and coarse arrays of both the positive and negative input paths. A bit cycling is then performed through the input capacitor arrays $C_{INTOTN}$ and $C_{INTOTP}$, as previously described.

Implementing the input and offset arrays 401/402 in an integrated circuit presents significant challenges. Among other things, the bit-weighted capacitors must be matched to the desired resolution of the DAC. To do so, the unit (1C) capacitors must be made a large as possible. This in turn forces the capacitors representing the most significant bits to become very large, since in the traditional bit-weighting scheme capacitor size generally increases in powers of two, as shown in FIG. 4. Thus, for example, for an 8-bit array, the MSB capacitor has an area of $2^7C$ and the total area required for the entire array is $2^8C$. Moreover, the larger capacitances require the use of larger signal drivers, especially in high speed applications.

Figure 6A:
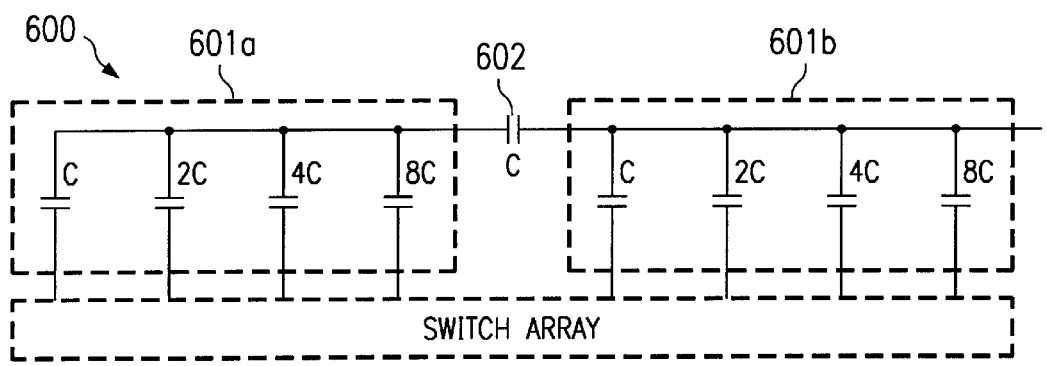
FIG. 6A is an electrical schematic diagram of a segmented capacitor array suitable for use in the input and/or offset arrays of FIGS. 4 and 5.

As shown in FIG. 6A, according to the present inventive concept, the given capacitor array is segmented into at least two segments. In the example of FIG. 6A, capacitor array 600 is divided into two segments 601a and 601b bridged by a unit-valued (1C) capacitor 602. Each segment 401a,b consists of an array of 4 bit-weighted capacitors of weights C, 2C, 4C and 8C, where C is the unit capacitance. It should be noted that the number of capacitors in segments 601a,b may vary, depending on the embodiment. Moreover, the array can be segmented into more that two segments 601, with each segment coupled by a unit capacitor 602. Finally, segments 601a,b can be symmetric (in number of capacitors) or asymmetric.

Figure 6B:
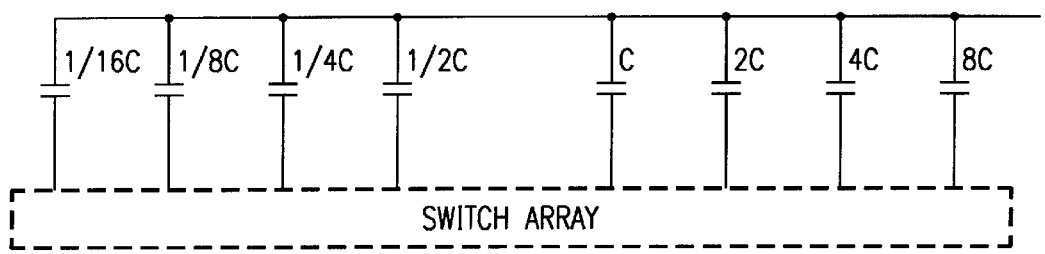
FIG. 6B is a diagram of the equivalent circuit of FIG. 6A.

The equivalent circuit is shown in FIG. 6B, where the capacitance values are to a first order approximation. In the 8-bit embodiment shown, the effective capacitance values of the bit-weighted capacitors graduate in the sequence $\frac{1}{16}C$, $\frac{1}{8}C$, $\frac{1}{4}C$, $\frac{1}{2}C$, 1C, 2C, 4C and 8C. Advantageously, by making the LSB capacitors of segments 601a,b and bridge capacitor 602 all have unit capacitance, a fractional value for bridge capacitor 602 is not required, if a first order approximation of the fractional equivalent capacitor values is acceptable. (When used in to construct either input arrays 601 or offset arrays 602, the normal and calibration mode sampling and conversion phases are performed as discussed above.)

In the illustrated 8-bit embodiment of FIG. 6A, the largest capacitors which must be fabricated are the 8C capacitors of each segment. The total size for each segment 601 is 15C and the total size of the entire array 600 is 30C. In contrast, in a conventional 8-bit array, the largest capacitor is $2^7C$ or 128C and the total size of the array is $2^8C$ or 256C.

In switched-capacitor circuits, the problem of parasitic capacitance must be addressed to optimize performance. With respects to the circuits of FIG. 4B, parasitic capacitance is introduced at the bottom plates of the capacitors of input and offset compensation arrays 401 and 402 as well by the junction capacitance of the associated switches 403/404. Among other things, this parasitic capacitance can cause a reduction in bandwidth and settling accuracy. Moreover, parasitics can cause non-linearities in the switching network, when bootstrapped gates are used in the switching transistors.

Figure 6C:
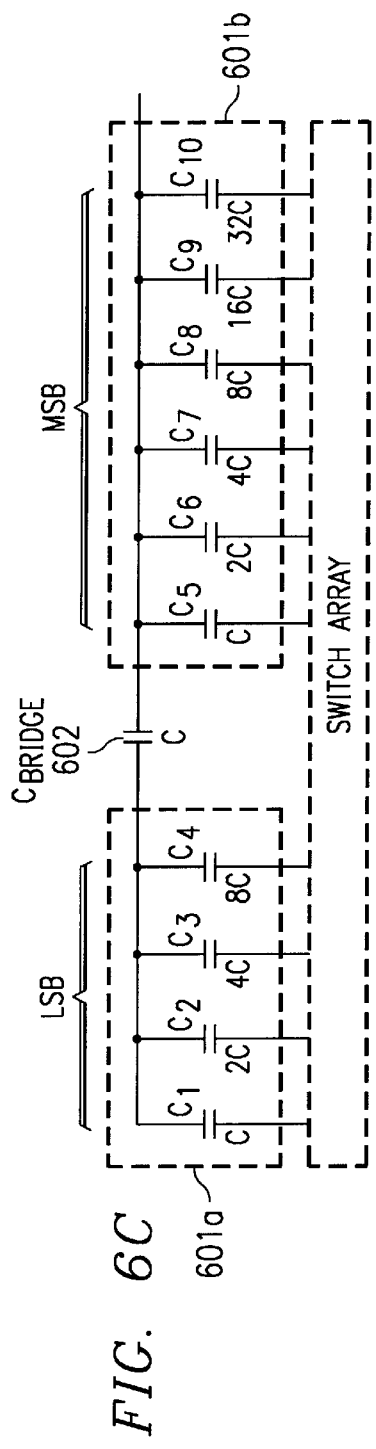
FIG. 6C is an electrical schematic diagram showing the array of FIG. 6A partitioned into asymmetric MSB and LSB segments for gain scaling purposes.

According to the inventive concepts, bridged arrays such as array 600 also advantageously used to reduce the effects of parasitic capacitance in the input arrays 401. These bridged arrays are again segmented into at least two segments as shown in FIG. 6C, one for the LSB capacitors and one for the MSB capacitors. During sampling of the input signal voltage $A_{IN}$, only the capacitors of the MSB segment are charged while those of the LSB segment are coupled to the common mode voltage $V_{CM}$. Consequently, the bottom plate parasitic capacitance of the LSB capacitors, as well as the capacitance of the associated switches, are not charged from the input thereby improving the speed and linearity of the circuit. After the bit cycling is performed, through both the LSB and MSB segments, the error introduced by this procedure is compensated for in the digital domain. This process is illustrated in the following example.

Figure 6D:
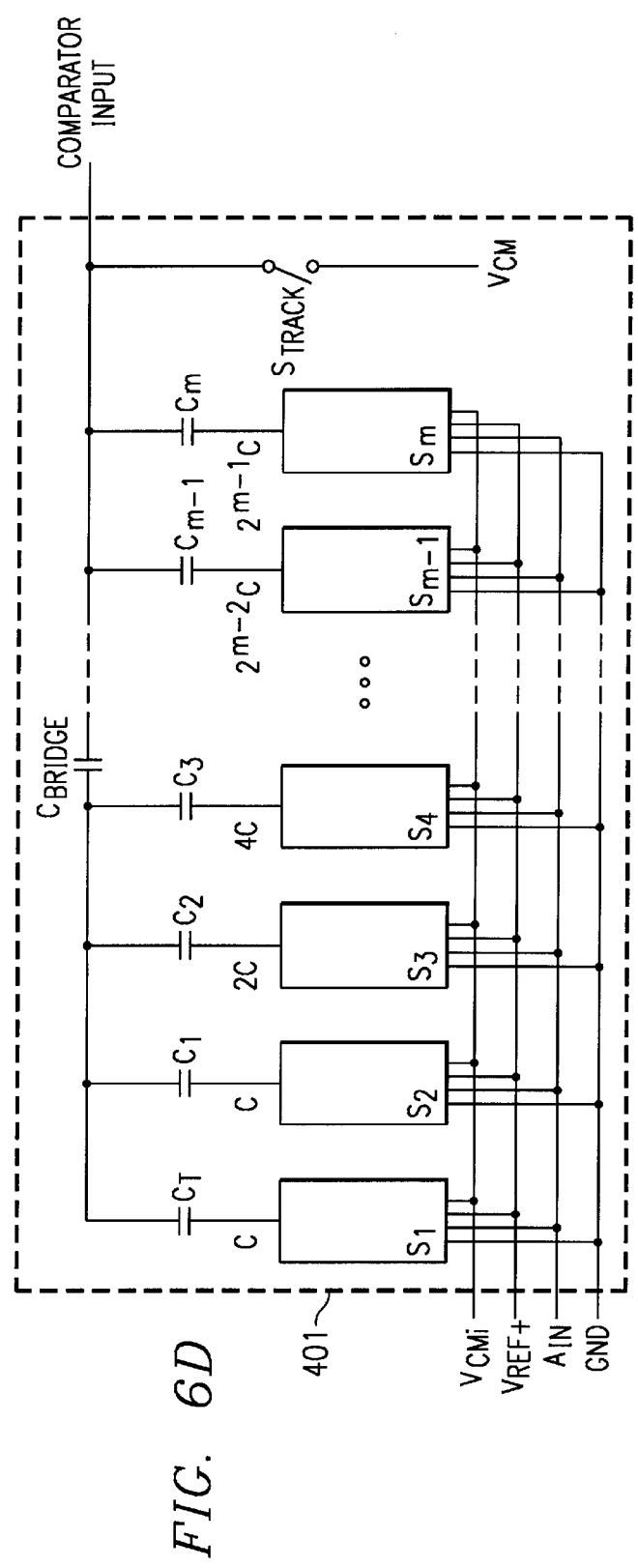
FIG. 6D illustrates an embodiment wherein a segmented array is used in the construction of the input capacitor arrays.

FIG. 6D illustrates an embodiment wherein a segmented array is used in the construction of the input capacitor arrays 401a, b. The segments 601a,b can respectively be used to represent the MSBs and LSBs in each input capacitor array 401a,b. Assume that LSB segment 601a for each array comprises 4 capacitors ($C_1$–$C_4$) having values C, 2C, 4C and 8C and MSB segment 601b comprises 4 capacitors ($C_5$–$C_{10}$) with values C, 2C, 4C, 8C, 16C and 32C.

During the sampling phase, the bottom plates of MSB capacitors $C_5$–$C_{10}$ sample $A_{IN}$ and the bottom plates of LSB capacitors $C_1$–$C_4$ are coupled to Vcm. The effective capacitance of the parallel LSB capacitors in series with the unit-valued bridge capacitor 603 is approximately equal to 1C. The approximate gain error introduced is therefore on the order of:

$$(1 - \tfrac{1}{2}^k), \quad (2)$$

where k is the number of capacitors in each MSB segment.

A conventional SAR bit cycling process is performed using all capacitors $C_7$–$C_{10}$ of both the LSB and MSB segments of the positive and negative paths.

If more MSB capacitors are used for the given number of LSB capacitors, then the error decreases. If fewer MSB capacitors are used for a given number of LSB capacitors, the error increases.

While a particular embodiment of the invention has been shown and described, changes and modifications may be made therein without departing from the invention in its broader aspects, and, therefore, the aim in the appended claims is to cover all such changes and modifications as fall within the true spirit and scope of the invention

What is claimed is:

1. A method of gain scaling in switched capacitor circuit comprising the steps of:
   segmenting a bit-weighted capacitor array into a first segment having at least one capacitor representing a least significant bit and a second segment having at least one capacitor representing a most significant bit; and
   during a sampling phase, sampling an input signal onto the at least one capacitor of the second segment and coupling the at least one capacitor of the first segment to a differential common mode voltage.

2. The method of claim 1 further comprising the step of:
   during a conversion phase, performing a bit cycling operation using both said first and second segments.

3. The method of claim 1 and further comprising the step of coupling the first and second segments with a bridge capacitor.

4. The method of claim 1 wherein a number of capacitors in the first segment is less than a number of capacitors in the second segment.

5. An analog to digital converter comprising:
   a comparator;
   an array of capacitors coupled to an input of said comparator and segmented into a first segment of capacitors representing most significant bits and a second segment of capacitors representing least significant bits; and
   switching circuitry operable during a sampling phase to selectively couple said capacitors of said first segment to an analog input of said converter and said capacitors of said second segment to a differential common mode voltage.

6. The analog to digital converter of claim 5 and further comprising a bridge capacitor coupling said first and second segments of said array of capacitors.

7. The analog to digital converter of claim 6 wherein:
   said first segment of said array of capacitors comprises m-number of capacitors having weighted capacitance values ranging from a unit capacitance to $2^{m-1}$ times the unit capacitance;
   said second segment of said array of capacitors comprises n-number of capacitors having weighted capacitance values ranging from the unit capacitance value to $2^{n-1}$ times the unit capacitance value; and
   said bridge capacitor of has a capacitance approximating said unit capacitance value.

8. The analog to digital converter of claim 5 wherein said switching circuitry is further operable during a conversion phase to perform a bit cycling operation through said first and second segments of said array of capacitors.

9. The analog to digital converter of claim 5 and further comprising an offset compensation capacitor array coupled to said input of said comparator.

10. The analog to digital converter of claim 5 further comprising:
    a second array of capacitors coupled to a second input of said comparator and segmented into a first segment of capacitors representing the most significant bits and a second segment of capacitors representing the least significant bits; and
    switching circuitry operable during a sampling phase to selectively couple said capacitors of said first segment of said second array to the analog input of said converter and said capacitors of said second segment to the differential common mode voltage.

11. An analog to digital converter comprising:
    a data conversion path comprising:
    a comparator having first and second differential inputs;
    a first capacitor array coupled to the first input of the comparator and comprising first and second segments coupled by a bridge capacitor;
    a second capacitor array coupled to the second input of the comparator comprising first and second segments by a bridge capacitor; and switching circuitry for selectively coupling the first segments of the first and second capacitor arrays to a converter input and the second segments of the first and second capacitors arrays to a differential common mode voltage during a sampling phase.

12. The analog to digital converter of claim 11 wherein the data path comprises a selected one of a plurality of parallel data paths.

13. The analog to digital converter of claim 12 wherein the plurality of data paths are interleaved.

14. The analog to digital converter of claim 11 wherein the first segments of the first and second capacitor arrays represent most significant bits and the second segments of the first and second capacitor arrays represent least significant bits.

15. The analog to digital converter of claim 11 wherein the first and second segments of the first capacitor array each comprise at least one capacitor having a capacitance approximating a capacitance of the bridge capacitor.

16. The analog to digital converter of claim 11 wherein the first and second segments of the second capacitor array each comprise at least one capacitor having a capacitance approximating a capacitance of the bridge capacitor.

* * * * *